(12) United States Patent
Hayashi et al.

(10) Patent No.: US 7,857,960 B2
(45) Date of Patent: *Dec. 28, 2010

(54) COPPER PLATING PROCESS

(75) Inventors: Shinjiro Hayashi, Saitama (JP); Hisanori Takiguchi, Saitama (JP)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/228,194

(22) Filed: Aug. 11, 2008

(65) Prior Publication Data

US 2009/0038949 A1 Feb. 12, 2009

(30) Foreign Application Priority Data

Aug. 10, 2007 (JP) .............................. 2007-210538

(51) Int. Cl.
C25D 5/34 (2006.01)
C25D 3/38 (2006.01)

(52) U.S. Cl. ...................................... 205/210; 205/291

(58) Field of Classification Search .................. 205/210, 205/291

See application file for complete search history.

(56) References Cited

U.S. PATENT DOCUMENTS

| 589,623 | A | * | 9/1897 | Chen et al. | .................. | 131/175 |
| 2,931,760 | A | | 4/1960 | Westbrook | ..................... | 204/52 |
| 4,336,114 | A | * | 6/1982 | Mayer et al. | ................. | 205/298 |
| 4,374,709 | A | * | 2/1983 | Combs | ........................ | 205/158 |
| 4,604,299 | A | * | 8/1986 | De Luca et al. | ............. | 427/98.5 |
| 5,514,258 | A | * | 5/1996 | Shimakura et al. | ......... | 252/79.2 |
| 5,616,549 | A | * | 4/1997 | Clark | ......................... | 510/412 |
| 6,645,364 | B2 | * | 11/2003 | Calvert et al. | ................. | 205/81 |
| 6,709,564 | B1 | | 3/2004 | Tench et al. | .................. | 205/291 |
| 6,793,796 | B2 | | 9/2004 | Reid et al. | .................. | 205/102 |
| 6,863,795 | B2 | * | 3/2005 | Teerlinck et al. | ............ | 205/210 |
| 6,946,065 | B1 | | 9/2005 | Mayer et al. | ................. | 205/102 |
| 7,232,528 | B2 | * | 6/2007 | Hosomi et al. | ................ | 252/79 |
| 7,405,157 | B1 | * | 7/2008 | Reid et al. | .................. | 438/677 |
| 2004/0045832 | A1 | * | 3/2004 | Martyak | ..................... | 205/131 |
| 2006/0049058 | A1 | * | 3/2006 | van Wijngaarden et al. | . | 205/291 |
| 2006/0252254 | A1 | * | 11/2006 | Basol | ......................... | 438/628 |
| 2007/0215490 | A1 | * | 9/2007 | Dow et al. | .................. | 205/775 |
| 2009/0038951 | A1 | * | 2/2009 | Hayashi et al. | ............. | 205/291 |

FOREIGN PATENT DOCUMENTS

| DE | 1 072 860 | | 1/1960 |
| JP | 05255860 | A * | 10/1993 |
| SU | 427097 | A * | 10/1974 |
| SU | 697552 | A * | 11/1979 |
| SU | 819233 | | 4/1981 |
| SU | 1010161 | A1 * | 4/1983 |
| WO | WO 01/24239 | A1 | 4/2001 |
| WO | WO 03/000954 | A1 * | 12/2003 |

OTHER PUBLICATIONS

Carvalhal et al., "Polycrystalline Gold Electrodes: A Comparative Study of Pretreatment Procedures Used for Cleaning and Thiol Self-Assembly Monolayer Formation", Electroanalysis (no month, 2005), vol. 17, No. 14, pp. 1251-1259.*
Smol'yaninov, "The Influence of Halide Ions on the Corrosion Stability and the Electrochemical Behavior of Copper in Sulfuric and in Hydrochloric Acid", Izvestiya Vysshikh Uchebnykh Zavedenii, Khimiya i Khimicheskaya Tekhnologiya (no month, 1964), vol. 7, No. 4, pp. 588-593. Abstract Only.*
Smol'yaninov, "The Influence of Halide Ions on the Corrosion Stability and the Electrochemical Behavior of Copper in Sulfuric and in Hydrochloric Acid", Izvestiya Vysshikh Uchebnykh Zavedenii, Khimiya i Khimicheskaya Tekhnologiya (no month, 1964), vol. 7, No. 4, pp. 588-593. Full Document.*
Website: http://swatlab.nmsu.edu/conv.html; Conversion Factors; downloaded Nov. 16, 2009.
Smol'yaninov; The Influence of Halide Ions on the Corrosion Stability and the Electrochemical Behavior of Copper in Sulfuric and Hydrochloric Acid; *Izvestiya Vysshikh Uchebnykh Zavedenil, Kimiyai I Khimicheskaya Teknologiya*; (1964), vol. 7, No. 4, pp. 588-593.

* cited by examiner

*Primary Examiner*—Edna Wong
(74) *Attorney, Agent, or Firm*—John J. Piskorski

(57) ABSTRACT

Providing a copper plating method with which to precipitate copper-plated membranes that are uniform and flat, and that have good mirror gloss even when relatively thin copper plated membranes are formed. A copper plating method wherein the object to be plated and a pre-treatment solution in which bromide compound ions are contained are brought into contact and copper is precipitated by means of electrical plating using a copper plating solution.

8 Claims, No Drawings

COPPER PLATING PROCESS

This invention relates in general to a copper plating method. To give more detail, this invention relates to a pre-treatment solution and a method of copper plating wherein it is used such as is appropriate for the formation of a copper plating layer wherein the thickness of the membrane on the metal layer is up to 20 μm.

There is a variety of industrial applications for the use of electrolytic copper plating. For example, it is also used for decorative-plated membranes and corrosion-protection membranes. Also, it is used in the electronic industry for the manufacture of printed circuit boards and semi-conductors. In the manufacturing of circuit boards, copper plating is utilized for the wiring layers that are formed on the surfaces of circuit boards and for the conductive layers of the wall surfaces of the through holes that perforate between the surfaces of the printed circuit boards.

In the electrolytic plating methods for the formation of a metal membrane on items such as copper-clad laminates, printed wiring boards, and wafers, electrolytic plating is generally performed after a degreasing process for the removal of the oils and fats that are adhering to the surface of the printed circuit board, followed by a water rinse, followed by an acid activation process, and a discretionary water rinse. In the degreasing process the object to be plated is processed using an acidic liquid solution that contains an acid such as phosphoric acid and an additive such as a surfactant. In the acid activation process with which the residual oxidative products on the surface of the metal, the object to be plated is processed using an acidic liquid solution for which sulfuric acid is the main component in order to remove the residual oxidative products on the surface of the metal. This acid activation process is sometimes referred to as a pre-dip bath. Generally, copper plating solutions contain copper ions that are dissolved from copper sulfate salt and such, sufficient volume of electrolytes such as sulfur to contribute to the conductivity of the plating bath and polisher agents or copper precipitation accelerants (brighteners) for improving the uniformity of the plated membrane, quality, etc., high polarization agents (levelers), surfactant agents, copper precipitation prevention agents, etc.

In the electrolytic copper plating solution that is used in the manufacture of printed circuit boards, it is known that it is possible to obtain uniformly deposited on the printed circuit board polished copper plating membranes by using polisher agents, leveling agents, surfactant agents, and such. Plating solutions to which polyalkylene oxide and chloride compound ions have been added (for example U.S. Pat. No. 2,931,760) are known as the additives for copper sulfate and copper sulfate containing copper sulfate plating solution composition substances. In the patent document in question, it is disclosed that chloride compound ions and bromide compound ions have similar actions and that it is possible to use chloride compound ions and bromide compound ions as additives in copper plating solutions. It is also known that there are plating solutions for a sulfuric acid copper plating solution that do not contain organic additives and chloride compound ions and that contain bromide compound ions or iodine ions (for example JP 63-186893) and that there are plating solutions that include alkylene oxide compounds and the reaction product(s) of epichlorohydrin (for example JP 2004-250777).

However in recent years, because of fears of losing the folding characteristics and flexibility of boards when flexible printed circuit boards are manufactured using materials such as polyimide resins, there have come to be restrictions on the thickness of the conductivity circuitry layer that is formed on the board. However, in general when relatively thick layers of about 20 μm that are obtained using the heretofore technology are precipitated, the resulting copper layer did not have good external appearance or physical characteristics. That is to say, when the thickness of the copper-plated layer is thicker than about 20 μm, on the surface of the copper plating membrane, there was a difference in substrate metal layer surface roughness and the size of the precipitated copper-plated grain thus rendering difficult to obtain copper-plated membrane with uniform and quality luster.

The objective of this invention is to provide a copper plating method with which it is possible to accumulate copper-plated membranes that have, even if the thickness of the copper-plated membranes is thin, a uniformly precipitated and flat surface and a mirror-polish. In particular, the objective of this invention is to provide an electrolytic copper plating method that is capable of forming copper plating membranes that have a uniformly precipitated and flat surface and a mirror finish for instances of copper plating for copper-clad laminates and the copper plating for the purpose of forming thin copper plating on the conductivity circuitry of printed circuit boards.

As a result of having carefully studied, for the purpose of solving the aforementioned problems, the copper plating methods and the pre-treatment solutions, the inventors have found that it is possible, by treating prior to conducting the electrolytic copper plating process in the course of the copper plating method, to deposit a copper plating membrane that is evenly precipitated with excellent polish and that has a smooth surface by treating the object to be plated with a liquid solution that contains bromide compound ions, and have achieved this invention.

This invention provides as one illustrative embodiment a copper plating method that is characterized by the fact that it is a copper plating method wherein the copper plating is precipitated by the use of a copper plating solution after a pre-treatment solution that contains at least 0.75 mg/l of bromide compound ions and the object to be copper plated are brought into contact.

This invention provides as another illustrative embodiment a copper plating method that is characterized by the fact that it is a copper plating method wherein the copper plating is precipitated by the use of a copper plating solution after a pre-treatment solution that contains at least 0.75 mg/l of bromide compound ions is brought into contact with the object to be plated This invention also provides a copper plating method that is characterized by the fact that it is a copper plating method wherein the copper plating is precipitated by the use of a copper plating solution after the pre-dip acidic liquid solution that contains at least 0.75 mg/l of bromide compound ions and the object to be plated are brought into contact and water rinsed.

Furthermore, another illustrative embodiment of this invention is a copper plating method whereby copper plating is precipitated by means of electrolytic copper plating using a copper plating solution after the object to be plated is brought into contact with a pre-treatment solution that contains at least 0.75 mg/l of bromide compound ions; it provides a copper plating method that is characterized by the fact the copper plating solution contains copper ions, electrolytes, chloride compound ions, and bromide compound ions, and in which the chloride compound ions and bromide compound ions contained in the aforementioned copper plating solution fulfill the relationship in the (1), (2), and (3) of the equations described below:

Equation 1:

$$(Cl-30)/20 < Br(130+Cl)/20 \quad (1);$$

$$50-Cl<10\times Br \quad (2);$$

$$10<Cl \quad (3)$$

In the equations, Cl is the concentration of the chloride compound ions (mg/l) in the ingredients of which the copper plating solution is composed; the Br is the concentration of the bromide compound ions (mg/l) in the components of the copper plating solution.

Another illustrative embodiment of this invention is to provide a pre-treatment solution electrolytic copper plating composition that contains at least 0.75 mg/l of bromide compound ions.

It is possible by the use of the copper plating method of this invention to precipitate a copper plating membrane that has an excellent external appearance, is evenly precipitated, and that has an even surface even when the precipitated copper plating membrane is relatively thick. Thin copper plating membranes with a mirror-polish are advantageous in the formation of circuits on flexible printed circuit boards.

The abbreviations that are used throughout this specification have, unless specified to the contrary, the following meanings:

g=grams; mg=milligrams; °C.=degrees Celsius; min=minute; m=meter; cm=centimeter; μm=micron (micrometer); l=liter; ml=milliliter; A=ampere; mA/cm²=milliampere per square centimeter; ASD=ampere per square decimeter; dm²=square decimeter. The ranges of all numerical values, unless specified to the contrary, include the threshold limit value; furthermore, arbitrary combination of order is possible. All volumes, unless specified to the contrary, are weight percentages and all ratios are based on weight.

In terminology used in this specification "plating solution" and "plating bath" have the same meaning and are interchangeable. The term "brightener" means an organic additive agent that has the action of increasing the precipitation speed of the electrolytic plating bath, and has the same meaning as the term "precipitation accelerant agent" and the term "polisher agent" and are interchangeable. The term "precipitation suppressant agent" has the same meaning as the term "carrier"; it means an organic additive agent that has the action of suppressing the copper plating precipitation speed in electrolytic plating. The term "leveler" or "leveling agent" means an organic compound that has the action of forming what is actually an evenly precipitated metal layer. The term "alkane," "alkanol" or "alkylene" indicates either straight chained or branched chain alkane, alkanol, or alkylene.

This invention is a copper plating method that is characterized by the fact that an object to be plated—for example, a built-up printed circuit board, a flexible printed circuit board, wafer, etc.,—is brought into contact with a treatment solution that contains at least 0.75 mg/l of bromide compound ions, after which copper plating is precipitated by means of electrolytic copper plating using a copper plating solution.

The bromide compound ion containing treatment solution of this invention may be a pre-treatment solution that is brought into contact with the object to be plated immediately prior to conducting the electrolytic copper plating process or it may be a pre-dip acidic liquid solution that is used for acid activation process. Which is to say that it is possible to have an electrolytic copper plating method that includes:

(i). A process for degreasing treatment of the object to be plated;

(ii). A process for conducting an acid activation;

(iii). A process for bringing into contact a pre-treatment solution that contains bromide compound ions and the object to be plated;

(iv). A process for electrolytic plating.

Water washing between each of the processes does not effect what is obtained by the method of this invention; as required, it is possible to perform a water wash between each of the processes.

Also, by means of the addition of bromide compound ions to the pre-dip acidic liquid solution used in the acid activation process, it is possible to simultaneously conduct the above described (ii) and (iii). It is also possible to process the object to be plated with a pre-dip acidic liquid solution and then to treat the object to be plated with a pre-treatment solution that contains bromide compound ions.

In this invention it is preferable for the pre-treatment solution that contains bromide compound ions to be an aqueous solution that contains bromide compound ions. The bromide compound ions in an aqueous solution should be at least 0.75 mg/l or greater; it is preferable for it to be 1 mg/l or greater and it is even more preferable for the volume to be 2 mg/l or greater. It is possible to add 1000 mg/l of bromide compound ions into the pre-treatment solution; it is preferable to add up to 100 mg/l. Although it is possible for the pre-treatment solution that contains bromide compound ions to contain other compounds, surfactant agents, acids, corrosion prevention agents, etc., it is preferable for it to be an aqueous solution that is composed of bromide compound ions and water. It is possible to use de-ionized water, tap water, distilled water, etc., for the water.

In this invention it is preferable that the bromide compound ions be soluble in the pre-treatment liquid solution or the pre-dip acidic liquid solution and be such that it can provide bromide compound ions (bromide ions) provided from a bromide compound source. As this source of bromide compound ions, it is possible to suggest bromide compounds ions that do not adversely affect the pre-treatment solution and the copper plating bath such as hydrogen bromide, potassium bromide, sodium bromide, magnesium bromide, copper bromide (II), silver bromide, bromoform, carbon tetrabromide, ammonium bromide, tetraethylammonium bromide and 1-ethyl-3-methyliomidazolium bromide. These bromide compound ion sources may be used alone or in a combination of 2 or more.

In this invention, the pre-dip acidic liquid solution and acid activation processing are mainly for the purpose of removing the acid substances that remain on the metal surface of the object to be plated. It is preferable for the pre-dip acidic liquid solution to be an aqueous solution that contains an acid. Specifically, for example, aqueous solutions of sulfur, methanasulfonic acid, and fluoborate can be cited. The acid may be used alone or in a combination of 2 or more. The pre-dip acidic liquid solution is one in which the aforementioned acid is an aqueous solution that contains 1% by weight to 50% by weight; 5% by weight to 20% by weight is preferable. Also, the pre-dip acidic liquid solution may, if desired, contain other than bromide compound ions, halogen ions, organic compounds that contain nitrogen atoms, organic compounds that contain sulfur atoms, etc.

As examples of the aforementioned surfactant agents, surfactant agents of the anionic series, cationic series, non-ionic series or amphoteric series can be cited; in particular the non-ionic surfactant agents are preferable. The preferable non-ionic surfactant agents are polyethers that contain within 1 molecule ether oxygen atoms. Specifically, for example, polyoxyalkylene additives such as polyoxyethylene lauryl ether, polyethylene glycol, polypropylene glycol, polyoxyethylene alkyl ether, polyoxyethylenepolyoxypropyleneglycol, polyoxyethylene nonylphenylether, polyoxyethylenepolyoxypropylenealkylamine and ethylenediamine can be cited; the preferable ones are polyoxyethylenemonobutylether, polyoxypropylenemonobutylether, polyoxyethylene polyoxypropyleneglycolmonobutylether, etc., of polyoxyethylenemonoalkyl ether, polyethylenegycol or phenylethoxylate with 5 to 500 repeating units. Such additive agents may be used alone or in a combination of 2 or more.

As for the halogen ions that may be contained in the pre-dip acidic liquid solution in addition to the bromide compound ions, chloride compound ions (chloride ions), iodine ions, and such can be cited. It is preferable for the chloride compound ions to be soluble in the pre-dip acidic liquid solution and for them to be from a chloride compound source that is capable of supplying chloride compound ions (chloride ions). As for sources of such chloride compound ions, sodium chloride, copper chloride, aluminum chloride, lithium chloride, potassium chloride, and such, that do not adversely affect the pre-dip acidic liquid solution and the copper plating bath can be cited. In the same way, for the iodine ions it is preferable for them to be soluble in the pre-dip acidic liquid solution and from an iodine ion source that can supply iodine ions. These chloride ions and iodine ions can be used alone or in combinations of 2 or more.

As for the organic compounds that contain nitrogen atoms that can be contained in the pre-dip acidic liquid solution, it is possible to cite such as amine compounds, amide compounds thioamide compounds, compounds that have an aniline or pyridine ring, other heterocyclic compounds or condensed heterocyclic compounds and aminocarboxylic acid. Included are, for example, alkylamine, dialkylamine, trialkylamine, arylalkylamine, imidazole, triazole, tetrazole, benzimidozole, benzotriazole, piperidine, morpholine, piperazine, oxazole, benzoxazole, pyrimidine, quinoline, isoquinoline, thiourea, dimthylethiourea glycine, diaminotheylene-aminoacetic acid, N-methylglycine, dimethyleglycine, β-alanine, cysteine, glutamic acid, asparaginic acid, and imidazole, diethylenegylcol, epichlorhydrin and the products of the reaction that are disclosed in Unexamined Patent Application 2004-250777. Such organic compounds that have nitrogen atoms can be used alone or in a combination or 2 or more.

As sulfur atom containing organic compounds that may be contained in the pre-dip acidic aqueous solution, thiourea compounds, benzothiazole compounds, and such, that contain 1 or several sulfur atoms can be cited. Included amongst the organic compounds that have sulfides or sulfonic acid group are, for example, compounds that contain a —S—($CH_2O$—R—$SO_3M$ structure within the molecule or that contain —S—R—$SO_3M$ structure (in the formula, the M is hydrogen or an alkyl metal atom and the R is an alkylene group that contains from 3 to 8 carbon atoms). Specifically the following can be cited as examples: N,N-dimethyl-dithiocarbamic acid-(3-sulfopropyl) ester; 3-mercapto-propylsulfonic acid-(3-sulfopropyl) ester; 3-mercapto-propylsulfonoic acid sodium salt; 3-mercapto-propylsulfonic acid sodium salt; carbon-dithio-o-ethyl ester; bis-sulfoniocpropyldisulfide; bis-(3-sulfonepropyl-disulfide disulfide di-sodium salt; 3-(benzothiazolyl-s-thio) propylsulfone acid sodium salt; pyridinium propylsulfobetaine; 1-sodium-3-mercaptopropane-1-sulfonate; N,N-dimethyl-dithiocarbamic acid-(3-sulfoethyl) ester; 3-mercapto-ethylpropylsulfonic acid-(3-sulfoethyl); 3-mercapto-ethylsulfonic acid sodium salt; 3-mercapto-1-ethane sulfonic acid potassium salt; carbon-dithio-o-ethyl ester-s-ester; bis-sulfoethyldisulfide; 3-(benzothiazolyl-s-thio) ethyl sulfonic acid sodium salt; pyridinium thiethylsulfobetaine; 1-sodium-3-mercaptoethane-1-sulfonate; and thiourea compounds such as thiourea, 1,3-dimethyltiourea, trimethylthiourea, diethylethiourea and allythiourea.

The aforementioned compounds that may be added to the pre-dip acidic liquid solution of this invention may be added at will in volumes of ranges that do not have an adverse effect on the results of pre-dip acidic liquid solution. For example, to the pre-dip acidic liquid solution as a whole, the following volumes may be added: surfactant agents from 0 ppm to 200 ppm, preferably in the range of 1 ppm to 150 ppm; halogen ions 0 ppm to 200 ppm, preferably in the range of 100 ppm or less; organic compounds containing nitrogen atoms 0 ppm to 300 ppm, preferably in the range of 0 ppm to 150 ppm; organic compounds containing sulfur atoms 0 ppm to 10 ppm, preferably in the range of 7 ppm or less.

In the copper plating method of this invention, the addition of bromide compound ions into the pre-dip acidic liquid solution makes it possible to simultaneously perform the process of the acid activation treatment (ii) and the process of bringing the pre-treatment solution that contains bromide compound ions and the object to be plated (iii). The volume of the aforementioned bromide compound ions that are added into the pre-dip acidic liquid solution is 0.75 mg/l or higher, preferably 1 mg/l or higher, and more preferably 2 mg/l or higher. The volume of the aforementioned bromide compound ions that are added into the pre-dip acidic liquid solution is 1000 mg/l or higher and preferably 100 mg/l or higher.

The copper plating method of this invention is one with which the effects of this invention are obtained by the addition of bromide compound ions into a publicly known degreasing liquid solution that is used in the degreasing process of the object to be plated (i). In this case, the copper plating method includes a process wherein the degreasing liquid solution that includes bromide compound ions and the object to be plated are brought into contact, an acid activation process and a process in which the electrical plating is performed using a copper plating solution.

In the event that bromide compound ions are added to the degreasing solution, the concentration of the bromide compound ions in the liquid solution for the degreasing process is at least 50 mg/l, preferably 100 mg/l or higher and more preferably 200 mg/l or higher.

The copper plating method of this invention includes a degreasing process in which the object to be plated and the degreasing liquid solution are in contact with the solution temperature at 10° C. to 70° C., preferably ambient temperature to 50° C. for 10 seconds to 30 minutes, preferably 1 to 5 minutes, a process in which the object to be plated and the pre-dip acidic liquid solution are in contact with the solution at 10° C. to 70° C., preferably 20° C. ambient to 30° C. for seconds to 10 minutes, preferably 30 seconds to 5 minutes, a process in which the processed object to be plated is processed in a pre-treatment solution that contains bromide compound ions with the solution at 10° C. to 70° C., preferably 20° C. ambient ~30° C. for 10 seconds to 10 minutes, preferably 30 seconds to 5 minutes, and a copper plating method wherein a copper plating solution is used. The method for the addition of the bromide compound ions into the pre-dip acidic liquid solution or the decreasing liquid solution may be the same solution temperatures and times as described in the above.

In the case that a pre-dip acidic liquid solution that contains bromide compound ions is used in the acid activation treatment process, it is possible to not include the process by which the pre-treatment solution that contains bromide compound ions and the object to be plated are brought into contact (iii) after the acid activation treatment process in question.

Also, it is possible to use this (iii) process in lieu of a water wash and it is also possible to conduct the electrical copper plating treatment after the acid activation treatment process.

Publicly known copper plating solutions may be used for the copper plating solution of this invention. The copper plating solution contains copper ions, electrolytes, and desired additives.

The aforementioned bromide compound ions are at least partially soluble in the electric plating bath; it is preferable that they be provided by a copper ion source that is capable of providing copper ions. As a source of these copper ions copper salt is preferable; as examples such as copper sulfate, copper chloride, copper acetate, copper nitrate, copper fluoborate, copper methanesulfonate, copper phenylsulfonate and p-toluenesulfonate can be cited. In particular, copper sulfate or copper methanesulfonate is preferable. The source of copper ions may be alone or in a combination of 2 or more. Such metal salts are generally sold on the market and may be used without refining.

The range of the volume of copper ions supplied to the copper plating solution is normally 10 g/l to 200 g/l, 15 g/l to 100 g/l being preferable, and 20 g/l to 75 g/l being more preferable.

It is preferable for the above described electrolytes to be acid; included are sulfuric acid, acetic acid, alkyl sulfonic acids such as fluoborate acid, methanesulfonic acid, ethanesulfonic acid, propanesulfonic acid and trifluromethanesufonic acid, allysulfonic acids such as phenylsulfonic acid, phenolsulfonic acid and toluenesulfonic acid, sulfamic acid, hydrochloric acid, and phosphoric acid. In particular, methanesulfonic acid is preferable. It is possible to supply these acids in the form of a metal salt or a halide; they may be alone or in a combination of 2 or more. Such electrolytes may be generally sold on the market, and may be used without purification.

The range of the volume of electrolytes supplied to the copper plating solution is normally 1 g/l to 300 g/l, 5 g/l to 250 g/l being preferable, and 10 g/l to 200 g/l being more preferable.

As additive agents that may be contained in the copper plating solution, it is possible to use the halogen ions, surfactant agents, organic compounds that contain nitrogen atoms, organic compounds that contain sulfur atoms and such of the above described bromide compound ions, chloride compound ions, iodine ions, and such.

For the halogen ions, it is preferable for the copper plating solution to contain chloride compound ions and bromide compound ions. As for the concentration levels of the chloride compound ions and the bromide compound ions, it is preferable for the concentrations to fulfill the equations described below as (1) or (3) in terms of the concentration (mg/l) of the chloride compound ions (Cl) within the composition of the copper plating solution and the concentration (mg/l) of the bromide compound ions (Br) within the composition of the copper plating solution.

Equation 2:

$$(Cl-30)/20 < Br < (130+Cl)/20 \quad (1)$$

$$50-Cl < 10 \times Br \quad (2)$$

$$10 < Cl \quad (3)$$

That which is more preferable is that which fulfills the relationship of equations (4) and (5) indicated below.

Equation 3:

$$3 \leq Br \leq (70+Cl)/15 \quad (4)$$

$$20 \leq Cl \quad (5)$$

That which is even more preferable is that of a concentration such as would fulfill the relationship of equations (6) and (7) indicated below.

Equation 4:

$$3 \leq Br \leq 6 \quad (6)$$

$$30 \leq Cl \quad (7)$$

Also, it is preferable when a soluble positive electrode is used in the electrical plating and the range of the concentration level of the chloride compound ions in the copper plating bath exceeds 10 mg/l and is within 30 mg/l for the bromide compound ions to be at 2 to 8 g/l (mg/l), when the range of the concentration of the chloride compound ions in the copper plating bath exceeds 30 mg/l and is within 70 mg/l for the chloride compound ions to be at 1 to 10 g/l and when the range of the concentration of the chloride compound ions in the copper plating bath exceeds 70 mg/l and is within 100 mg/l for the chloride compound ions to be at 2 to 10 g/l. When the range of the concentration level of the chloride compound ions in the copper plating bath exceeds 30 mg/l and is within 70 mg/l, it particularly preferable for the range of the concentration of the bromide compound ions to be in the range of 2 to 8 g/l.

It is possible for the aforementioned copper plating solution to contain a publicly known precipitation accelerant agent. For precipitation accelerant agent, the selection is made from the aforementioned organic compounds that contain nitrogen atoms.

It is possible to use these precipitation accelerant agents in a variety of volumes; the volume to be used per each liter of the plating bath may be at least 1 mg, preferably at least 1.2 mg and more preferably at least 1.5 mg. For example, the volume of precipitation accelerant agent exists in the copper plating bath in the range of 1 mg/l to 200 mg/l. The volume of precipitation accelerant agent in the copper plating bath of this invention that is particular useful is 0 mg/l to 50 mg/l.

When surfactant agents are used in the copper plating solution, it is appropriate for the concentration level to be at 0 g/l or greater and 50 g/l or less, preferable for it to be 0.05 g/l or greater and 20 g/l or less and more preferable for it to be 0.1 g/l or greater and 15 mg/l or less.

For the components of the copper plating solution, it is possible to prepare by means of adding the aforementioned components in an at will order. For example, it is preferable to add the copper ion source and electrolytes to the water, followed by an addition of the chloride compound ions and the bromide compound ions, and, if necessary, the addition of the leveling agent, the precipitation accelerant agent, the surfactant agent, and such.

The copper plating method of this invention is performed by bringing into contact the object to be plated and the copper plating solution, and performing the electrical plating using the object to be plated as a cathode. As for the electrical plating method, it is possible to use publicly known methods. The concentration levels of each of the aforementioned components are adjusted for the plating method—barrel plating, through-hole plating, rack plating, high-speed continuous plating, etc.

It is possible to perform the aforementioned electrical plating method with the plating bath temperature at 10° C. to 65° C. and preferably at ambient temperature to 50° C. Also, the cathode current density can be appropriately selected to be in the 0.01 to 100 A/dm$^2$ and preferably in the 0.05 to 20 A/dm$^2$ ranges.

Although it is acceptable for no stirring to occur in the plating bath between the electrical plating processes, it also possible to select a method such as stirring by means of a vibration of the objects being processed, stirrer, etc., flow movement by means of a pump, air stirring, etc.

The copper plating method of this invention is one that can be used for any object to be plated wherein it is possible to electrically plate copper. As examples of such objects to be plated, it is possible to cite printed circuit boards, integrated circuits, semi-conductor packages, lead frames, inter-connectors, etc. In particular, it is useful in lead frames, flexible printed circuit boards, and such, wherein there is accumulation of relatively thin copper.

With the copper plating method of this invention it is possible to accumulate copper-plated membranes that are free of dimple-shaped pitting, have excellent luster, are evenly precipitated and have flat surfaces even if the membrane thickness is 20 microns or less, preferably 15 microns or less, and more preferably 12 microns or less.

This invention is explained by means of the following working examples, but these are merely working examples and as such do not restrict the scope of this invention.

WORKING EXAMPLE 1

20 mg/l of sodium bromide was added to de-ionized water to prepare a pre-treatment liquid solution. A 10 cm×5 cm rolled copper foil was subjected to a degreasing processing using an acid cleaner 1022B acidic degreaser (manufactured by Rohm and Haas Electronic Material K.K.); after performing a water wash for 1 minute with ambient temperature de-ionized water, it was dipped for 1 minute in a 25° C. pre-dip acidic liquid solution consisting of a 10% concentration sulfuric acid aqueous solution, after which it was dipped for 1 minute in a pre-treatment liquid solution that had been prepared at 25° C. solution temperature and then using the copper plating solution with the composition described below, the copper was precipitated using electrical plating. The electrical plating was performed using a positive soluble electrode made of phosphor copper at a solution temperature of 25° C. under 3ASD current density conditions, while performing air agitation; the electrical plating was conducted so as to precipitate an 8-micron thick copper plating membrane.

The obtained copper plating film was subject to gross and metal microscope PME3 (manufactured by Olympus Corporation). The copper plating film was deposited evenly and also had a smooth surface; there was no dimple-shaped pitting and it had a good mirror-glass outward appearance.

TABLE 1

| Copper Plating Solution (1) | |
| --- | --- |
| Copper Sulfate Penta-Hydrate | 75 g/l (19.1 g/l as copper) |
| Sulfuric Acid | 190 g/l |
| Hydrogen Chloride | 51.4 mg/l (50 mg/l as chloride ion) |
| Bis-(3-Sulfopropyl)-Disulfide Disodium Salt | 4 mg/l |
| Polyoxyethylenepolyoxypropyleneglycolmonobutylether (weight-average molecular weight 1100) | 1.5 g/l |
| Reaction Product of Imidazole and Diethyleneglycol and Epichlorohydrin Disclosed in Published Unexamined Patent Application 2004-250777 | 75 mg/l |
| De-ionized Water | Residual |
| pH Value | <1 |

WORKING EXAMPLE 2

Except that the volume of the sodium bromide was 1 mg/l, a copper plating membrane was precipitated on the rolled copper foil in the same manner as in Working Example 1. The copper plating membrane that was obtained had a good mirror-polish external appearance, was evenly precipitated, had a flat surface, and: had no dimple-shaped pitting.

WORKING EXAMPLE 3

Except that the volume of the sodium bromide was 50 mg/l, a copper plating membrane was precipitated on the rolled copper foil in the same manner as in Working Example 1. The copper plating membrane that was obtained had a good mirror-polish external appearance, was evenly precipitated, had a flat surface, and had no dimple-shaped pitting.

COMPARATIVE EXAMPLE 1

Except that sodium bromide was not added and de-ionized water was used for pre-treatment liquid solution, a copper plating membrane was precipitated on the rolled copper foil in the same manner as in Working Example 1. The copper plating membrane that was obtained had a good mirror-polish external appearance, was evenly precipitated, had a flat surface, and had no dimple-shaped pitting.

WORKING EXAMPLE 4

A pre-dip acidic liquid solution that contained 10 mg/l sodium bromide was added into a sulfuric acid liquid solution that was 10% by weight. A 10 cm×5 cm rolled copper foil was subjected to a degreasing processing using an acid cleaner 1022B acidic degreaser (manufactured by Rohm and Haas Electronic Material K.K.); after dipping for 1 minute in a 25° C. pre-dip acidic liquid solution copper was precipitated by means of electrical plating using the copper plating solution of Working Example 1. The electrical plating was performed using a positive soluble electrode made of phosphor copper at a solution temperature of 25° C. under 3ASD current density conditions, while performing air agitation; the electrical plating was conducted so as to precipitate an 8-micron thick copper plating membrane.

The obtained copper plating film was subject to gross and metal microscope PME3 (manufactured by Olympus Corporation). The copper plating film was deposited evenly and also had a smooth surface; there was no dimple-shaped pitting and it had a good mirror-glass outward appearance.

COMPARATIVE EXAMPLE 2

A copper plate film was deposited in the same manner as in Working Example 1 except that sodium bromide was not added to the pre-dip acidic liquid solution. Although the obtained copper plating film was deposited evenly, there was dimple-shaped pitting so it was not possible to obtain a mirror gloss.

WORKING EXAMPLES 5-9 AND COMPARATIVE EXAMPLES 3-4

Using a pre-dip acidic liquid solution wherein the concentration of the bromide compound ions in the pre-dip acidic liquid solution was adjusted as indicated in Table 2, copper plating membranes were precipitated using the same method as in Working Example 4 and examined. These results are shown in Table 2. The uniformity evaluation was performed based on the ratio of the membrane thickness of the plated membrane at the center of the copper foil versus the membrane thickness at the edge of the copper foil; 5=a difference under 20%, 4=a difference of 20% or greater and less than 40%, 3=a difference of 40% or greater and less than 60%, 2=a difference of 60% or greater and less than 80%, and 1=a difference of 80% or greater. The evaluation of the dimpled-shaped pitting on the surface of the copper plated membranes was that 5=none could be confirmed, 4=shallow pitting was confirmed, 3=pitting of a certain degree of depth was confirmed, 2=numerous deep pits were confirmed, and 1=deep pits were confirmed over the entire surface. NA means the pre-treatment solution was not used.

WORKING EXAMPLE 10

Except that 1 mg/l of sodium bromide was added to the pre-dip acidic liquid solution, the membranes were precipitate in the same manner as in Working Example 2, and the copper membranes that were obtained were examined. The results are shown in Table 2.

TABLE 4

| Copper Plating Solution (2) | |
|---|---|
| Copper Sulfate Penta-Hydrate | 75 g/l |
| | (19.1 g/l as copper) |
| Sulfuric Acid | 190 g/l |
| Hydrogen Chloride | 51.4 mg/l |
| | (50 mg/l as chloride ion) |
| Sodium Bromide | 5.15 mg/l |
| Bis-(3-Sulfopropyl)-Disulfide Disodium Salt | 4 mg/l |
| Polyoxyethylenepolyoxypropyleneglycolmonobutylether (weight-average molecular weight 1100) | 1.5 mg/l |
| Reaction Product of Imidazole and Diethyleneglycol and Epichlorohydrin Disclosed in Published Unexamined Patent Application 2004-250777 | 75 mg/l |
| De-ionized Water | Residual |

TABLE 2

| | Bromide Compound Ion Concentration mg/l | | | | |
|---|---|---|---|---|---|
| | Pre-Treatment Solution | Pre-Dip Acidic Liquid solution | Uniformity | External Appearance | Pitting |
| Working Example 1 | 20 | 0 | 5 | Flat, Mirror Gloss | 5 |
| Working Example 2 | 1 | 0 | 5 | Flat, Mirror Gloss | 5 |
| Working Example 3 | 50 | 0 | 5 | Flat, Mirror Gloss | 5 |
| Comparative Example 1 | 0 | 0 | 5 | Flat, Glossy | 1 |
| Working Example 4 | NA | 10 | 5 | Flat, Mirror Gloss | 5 |
| Comparative Example 2 | NA | 0 | 5 | Flat, Glossy | 1 |
| Comparative Example 3 | NA | 0.1 | 5 | Flat, Glossy | 2 |
| Comparative Example 4 | NA | 0.5 | 5 | Flat, Glossy | 3 |
| Working Example 5 | NA | 0.75 | 5 | Flat, Mirror Gloss | 4 |
| Working Example 6 | NA | 1.0 | 5 | Flat, Mirror Gloss | 5 |
| Working Example 7 | NA | 5.0 | 5 | Flat, Mirror Gloss | 5 |
| Working Example 8 | NA | 10.0 | 5 | Flat, Mirror Gloss | 5 |
| Working Example 9 | NA | 50.0 | 5 | Flat, Mirror Gloss | 5 |
| Working Example 10 | 1.0 | 1.0 | 5 | Flat, Mirror Gloss | 5 |

The pre-dip acidic solution was prepared using the bromide compound ions shown in Table 3 in place of the sodium bromide and the copper plating membranes were precipitated in the same manner as in Working Example 4 and examined. The results are shown in Table 3.

TABLE 3

| Additive Agent | Additive Volume | As Bromide Compound Ions | Uniformity | Flatness | Dimple-Shaped Pits |
|---|---|---|---|---|---|
| Copper Bromide (II) | 17.9 mg/l | 10 mg/l | 4 | Good | 5 |
| Hydrobromic Acid | 10.2 mg/l | 10 mg/l | 4 | Good | 5 |

WORKING EXAMPLE 12

Excluding the fact that the copper plating solution used was that of the below described composition, the same copper plating process as in Working Example 4 was performed. The copper-plated membrane that was obtained was precipitated evenly, had a smooth surface, and did not have any dimpled-shaped pits and had a good external mirror-gloss appearance.

WORKING EXAMPLE 13

Excluding the fact that 100 ppm of polyoxyethylenepolyoxypropyleneglycolmonobutylether was further added as a surfactant agent, the copper plating process was performed in the same manner as in Working Example 4.

The obtained copper plating membranes were uniformly precipitated, and also had flat surfaces and good external appearance with no dimple-shaped pits and with a good mirror gloss.

WORKING EXAMPLE 14

Excluding the fact that 50 ppm of hydrogen chloride was added into the pre-dip acidic liquid solution as chloride compound ions and that a water wash was performed immediately prior to the copper plating process, the copper plating process was performed in the same manner as in Working Example 4. The obtained copper plating membranes were uniformly precipitated, and also had flat surfaces and good external appearance with no dimple-shaped pits and with a good mirror gloss.

WORKING EXAMPLE 15

Excluding the adjustments made in the time required to perform copper plating processing so that the thickness of the precipitated membranes would be that indicated in Table 5, the copper plating process was performed in the same manner as in Working Example 4. In the same manner as with Working Example 4, the results of the obtained copper plating membranes are shown in Table 5.

TABLE 5

| Thickness of Copper Plated Membrane μm | Uniformity | Flatness | Dimple- Shaped Pits |
|---|---|---|---|
| 1 | 5 | Good | 4 |
| 3 | 5 | Good | 4 |
| 5 | 5 | Good | 5 |

What is claimed is:

1. A copper plating method comprising:
 a) activating an object to be plated with a pre-dip solution comprising acid and from 0.75 mg/l to 1000 mg/l of bromide ions, the object is of copper;
 b) contacting the object to be plated with a pre-treatment solution containing at least 0.75 mg/l of bromide ions; and
 c) precipitating a copper plate of 20 microns to 8 microns on the object by electrolytic copper plating using a copper plating solution containing copper ions, electrolytes, chloride ions and bromide ions, the chloride ions and the bromide ions are at concentrations to fulfill relationships of equations:
 (1) $(Cl-30)/20 < Br (130+Cl)/20$, (2) $50-Cl < 10 \times Br$ and (3) $10 < Cl$
 wherein Cl is chloride ion concentration in the copper plating solution in mg/l and Br is bromide ion concentration in the copper plating solution in mg/l.

2. The copper plating method of claim 1, wherein the pre-treatment solution further comprises one or more surfactants.

3. The copper plating method of claim 1, wherein the acid of the pre-dip solution is sulfuric acid.

4. The copper plating method of claim 1, further comprising a step of degreasing the object to be plated with a degreasing solution prior to activating the object to be plated with the pre-dip solution, the degreasing solution comprises at least 50 mg/l of bromide ions.

5. A copper plating method comprising:
 a) contacting an object to be plated with a pre-treatment solution containing from 0.75 mg/l to 1000 mg/l of bromide ions, the object is of copper; and
 b) precipitating a copper plate on the object by electrolytic copper plating using a copper plating solution containing copper ions, electrolytes, chloride ions and bromide ions, the chloride ions and the bromide ions are at concentrations to fulfill relationships of equations:
 (4) $3 \leqq Br \leqq (70-Cl)/15$ and (5) $20 \leqq Cl$ wherein Cl is chloride ion concentration
 in the copper plating solution in mg/l and Br is bromide ion concentration in the copper plating solution in mg/l.

6. A copper plating method comprising:
 a) contacting an object to be plated with a pre-treatment solution containing from 0.75 ml/l to 1000 mg/l of bromide ions, the object is of copper; and
 b) precipitating a copper plate on the object by electrolytic copper plating using a copper plating solution containing copper ions, electrolytes, chloride ions and bromide ions, the chloride ions and the bromide ions are at concentrations to fulfill relationships of equations:
 (6) $3 \leqq Br \leqq 6$ and (7) $30 \leqq Cl$ wherein Cl is chloride ion concentration
 in the copper plating solution in mg/l and Br is bromide ion concentration in the copper plating solution in mg/l.

7. The copper plating method of claim 6, wherein the copper plate is 15 microns to 8 microns.

8. The copper plating method of claim 7, wherein the copper plate is 12 microns to 8 microns.

* * * * *